United States Patent

Fattori et al.

[11] Patent Number: 5,952,869
[45] Date of Patent: *Sep. 14, 1999

[54] HIGH POWER MOS TRANSISTOR

[75] Inventors: Frank Fattori, Scotland, United Kingdom; Walter Bucksch, Freising, Germany; Erich Bayer, Piflas, Germany; Kevin Scoones, München, Germany

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/686,850

[22] Filed: Jul. 26, 1996

[30] Foreign Application Priority Data

Jul. 27, 1995 [DE] Germany .................. P195 27 486

[51] Int. Cl.⁶ .................. H03K 17/62; H03K 17/693; H03K 17/76
[52] U.S. Cl. .................. 327/404; 327/427; 327/430; 327/433
[58] Field of Search .................. 327/404, 427, 327/430, 431, 437, 434, 328, 87; 307/112, 113, 117, 125, 127, 130, 141.8

[56] References Cited

U.S. PATENT DOCUMENTS

| 4,635,084 | 1/1987 | Benjamin et al. | 357/22 |
| 4,977,341 | 12/1990 | Stein | 307/572 |
| 5,216,289 | 6/1993 | Hahn et al. | 326/87 |
| 5,422,588 | 6/1995 | Wynne | 327/437 |
| 5,436,578 | 7/1995 | Brown et al. | 326/87 |
| 5,552,744 | 9/1996 | Burlison et al. | 327/401 |

FOREIGN PATENT DOCUMENTS

| WO 093026092 | 12/1993 | WIPO | 327/437 |

Primary Examiner—Timothy P. Callahan
Assistant Examiner—An T. Luu
Attorney, Agent, or Firm—Gerald E. Laws; Robert D. Marshall, Jr.; Richard L. Donaldson

[57] ABSTRACT

A high power MOS transistor consists of a large number of sub-transistors (T1 to T6) connected in parallel. The gate electrodes of the sub-transistors (T1 to T6) can be driven individually via controllable switching elements (SW1 to SW6; SQ1 to SQ5).

3 Claims, 1 Drawing Sheet

HIGH POWER MOS TRANSISTOR

FIELD OF THE INVENTION

The invention relates to a high power MOS transistor, consisting of a large number of sub transistors connected in parallel.

BACKGROUND OF THE INVENTION

High power MOS transistors are produced by connecting in parallel, sub transistors, each of which is designed for a smaller power. By connecting the source, drain and gate terminals of the sub transistors in parallel, the high power MOS transistor behaves in an application circuit, like a component with the three usual terminals, i.e. a source terminal, a drain terminal and a gate terminal.

FIG. 2 shows how, according to the state of the art, sub transistors are connected in parallel to form a high power MOS transistor. This figure only shows six sub transistors T1 to T6, although a high power MOS transistor can be made up of a significantly larger number of sub transistors.

As a result of the manufacturing process in each connection to a gate terminal, a resistor R1 to R6 exists, which is formed by the resistance of the gate material which consists of polycrystalline silicon. Between the appropriate gate terminal and the relevant source terminal there is also a capacitor CGS1 to CGS6, which is shown in FIG. 2 for clarification. If a forward voltage is applied to the gate terminal G of such a power MOS transistor, then not all the sub transistors switch over to the on-state simultaneously, because the bias voltage reaches the gate electrode of the successive sub transistors via the delay line formed by the resistors R1 to R6 and the capacitors CGS1 to CGS6 delayed by a time constant resulting from a gate resistor and a gate source capacitance, with the result that the leading edge of a signal formed by the power MOS transistor is flattened out. Turning off the power MOS transistor can also not be carried out with a steep edge, but the result is a flattened turning off edge. This delayed turning on and off of the power MOS transistor may be desirable for certain applications but it represents a limitation which is annoying if steep turn-on and turn-off edges are to be obtained. Especially if, for example, a load controlled by the power MOS transistor is to be switched very quickly into the off-state, then it is not possible to achieve such rapid switching off because of the delay mentioned.

A further drawback of the power MOS transistor shown in FIG. 2 consists in the fact that it becomes totally unusable if the gate oxide breaks down at one transistor thus generating a short-circuit.

SUMMARY OF THE INVENTION

The object of the invention is to create a high power MOS transistor which makes rapid turn-on and turn-off edges possible and does not become unusable if a gate oxide breakdown occurs.

This problem is solved by the invention in that the gate electrodes of the sub transistors can be individually driven via controllable switching elements.

Because the gate electrodes can be driven individually, it is possible to apply the bias voltages, which cause the sub transistors to turn on or switch off, to all the gate electrodes simultaneously, i.e. without a time delay, so that the power MOS transistor very rapidly adopts the desired state (off or on). However, the fact that the gate electrodes can be driven individually also enables the bias voltages to be applied to the gate electrodes in order to achieve a desired turn-on or turn-off behaviour, so that the transistor is also ideal for use in applications where specific turn-on and turn-off edges are desired.

Further advantageous embodiments of the invention are indicated in the sub-claims.

BRIEF DESCRIPTION OF THE DRAWINGS

Embodiments of the invention are now explained with reference to the drawing, wherein.

DETAILED DESCRIPTION

Figure 1:
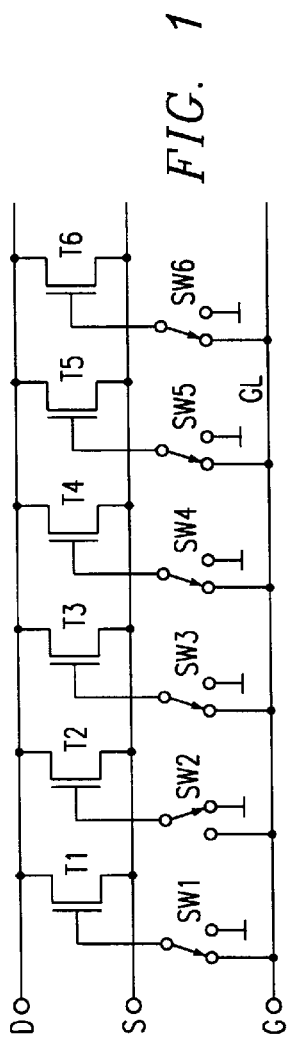
FIG. 1 shows some of the sub transistors of a high power MOS transistor according to the invention that is made up of many transistors of this type.
Figure 2:
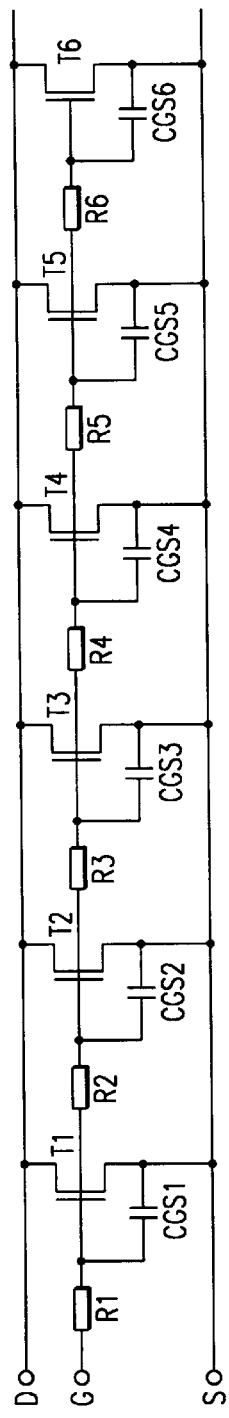
FIG. 2 shows a high power MOS transistor according to the state of the art and FIG. 3 shows a further embodiment of the MOS transistor according to the invention.

The high power MOS transistor depicted in FIG. 1 consists of a large number of sub transistors, of which, for reasons of space, only the transistors T1 to T6 are shown in FIG. 1.

As can be seen, the source and drain electrodes of the sub transistors are connected and accessible via a source terminal S and a drain terminal D, respectively. The gate electrodes in each case, are connected by way of a controllable switching element SW1 to SW6 to a common gate line GL, which is accessible via the gate terminal G. It should be pointed out that this common connection of the gate electrodes via the switching elements SW1 to SW6 represents only one possible way of driving the gate electrodes. It is also quite possible, to control each individual sub transistor or selected groups of sub transistors individually or in groups, by applying corresponding voltages to the gate electrodes.

In the embodiment of FIG. 1, the sub transistors T1 to T6 can be set either in the on or off state almost without any time delay, by applying a corresponding bias voltage to the gate terminal G. If a gate oxide breakdown exists at one of the sub transistors, then, with the help of the controllable switching element, it is possible to connect the gate electrode of this transistor to a suitable potential, for example, to ground, which will render this sub transistor ineffective, so that it has no more effect on the overall behaviour of the MOS transistor formed by all the sub transistors. In the case of partial transistor T2, it is assumed that there is a gate oxide breakdown; the switching element SW2 is therefore switched over, so that the gate electrode is connected to ground.

Figure 3:
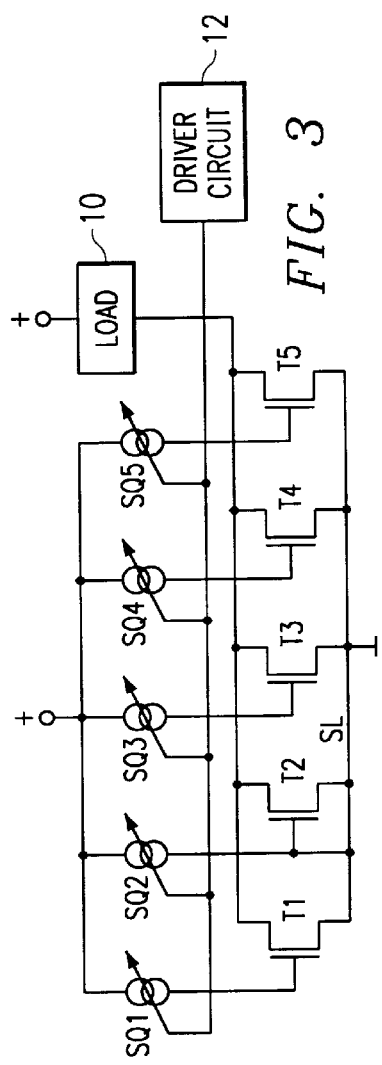

A further embodiment of the high power MOS transistor being described is shown in FIG. 3. For the sake of simplicity, it is assumed here, that the power MOS transistor consists of five sub transistors T1 to T5 and is used to control the current flowing through a load 10. The connection between the gate electrode of the transistor T2 and the common source line shown in FIG. 3, indicates that for this sub transistor T2, a gate oxide breakdown exists.

In the embodiment of FIG. 3, the gate electrodes of the sub transistors are driven via controllable current sources SQ1 to SQ5. Depending on the control signal supplied by a driving circuit 12, these current sources SQ1 to SQ5 supply the gate electrodes with current or draw current off these gate electrodes.

As a person skilled in the art is aware, the current sources are elements with a very high internal resistance, so that elements of high impedance are present in the drive path of the gate electrodes. Because of this high ohmic driving of the gate electrodes, any breakdown of the gate oxide, which results in a short-circuit between the gate electrode and the source line, has no negative effect on the overall behaviour of the power MOS transistor. The short-circuit merely results in a slight reduction of the on resistance of the MOS transistor, for example 1%, if the power MOS transistor is made up of a total of 100 sub transistors.

This positive behaviour has favourable effects on yield when manufacturing power MOS transistors, because even if one or more sub transistors fails, the MOS transistor produced can still be used for most purposes. Even if a breakdown of the gate oxide occurs during the course of operation, the MOS transistor does not immediately become unusable, but continues to exercise its control functions.

A person skilled in the art realizes that in order to control the transistors T1 to T5, the current sources must be such that they can both supply current to the gate electrodes and draw current off these gate electrodes.

Current can be supplied to and drawn off via a charge pump not illustrated in FIG. 3, which is connected to the common terminal of all the current sources SQ1 to SQ5. A person skilled in the art is aware of the design of such a charge pump and the design of suitable current sources, and these need no further explanation here.

We claim:

1. A high power MOS transistor, comprising:
   a plurality of sub-transistors, each sub-transistor having a source, a drain, and a gate electrode, with the source and the drain of each sub-transistor respectively connected together in a parallel manner, wherein the gate electrodes of the sub-transistors can be driven individually;
   a common gate terminal for providing a control signal to control the high power MOS transistor; and
   a controllable switching element from a plurality of controllable switching elements associated with each sub-transistor, the controllable switching element having a first terminal connected to the gate electrode of the respective sub-transistor, and a second terminal connected the common gate terminal, the controllable switching element being a current source operable to supply current to the gate electrode of the respective sub-transistor or to draw current from the gate electrode of the respective sub-transistor in response to the control signal on the common gate terminal, wherein the plurality of controllable switching elements each has a third terminal connected directly to a common potential terminal, such that each controllable switching element operates independently of any other of the plurality of controllable switching elements, such that current is supplied approximately simultaneously to the gate of each of the plurality of sub-transistors in response to the control signal on the common gate terminal.

2. The high power MOS transistor of claim 1, further comprising a gate oxide between the gate electrode and the source and drain of each sub-transistor;
   wherein a first of the plurality of sub-transistors has a defective gate oxide such that a short circuit exists between the gate electrode of the first sub-transistor and the source of the first sub-transistor; and
   wherein the high power MOS transistor is still operable in only a slightly degraded manner.

3. The high power MOS transistor of claim 1, wherein the plurality of sub-transistors comprises at least 100 sub-transistors.

* * * * *